United States Patent [19]

Bourekas et al.

[11] Patent Number: 5,343,435
[45] Date of Patent: Aug. 30, 1994

[54] USE OF A DATA REGISTER TO EFFECTIVELY INCREASE THE EFFICIENCY OF AN ON-CHIP WRITE BUFFER

[75] Inventors: Philip A. Bourekas, San Jose; Danh L. Ngoc, Saratoga; Scott Revak, Castro Valley, all of Calif.

[73] Assignee: Integrated Device Technology, Inc., Santa Clara, Calif.

[21] Appl. No.: 715,293

[22] Filed: Jun. 14, 1991

[51] Int. Cl.⁵ .............................................. G11C 19/28
[52] U.S. Cl. .................................. 365/221; 365/78; 365/189.02; 365/239
[58] Field of Search ................ 365/221, 219, 78, 239, 365/189.02

[56] References Cited

U.S. PATENT DOCUMENTS

| | | | |
|---|---|---|---|
| 4,151,609 | 4/1979 | Moss | 365/221 |
| 4,314,361 | 2/1982 | Jansen et al. | 365/221 |
| 4,642,797 | 2/1987 | Hoberman | 365/219 X |
| 4,646,270 | 2/1987 | Voss | 365/189.02 |
| 5,027,326 | 6/1991 | Jones | 365/221 |
| 5,097,442 | 3/1992 | Ward et al. | 365/78 |

Primary Examiner—Benny Lee
Attorney, Agent, or Firm—Skjerven, Morrill, MacPherson, Franklin & Friel

[57] ABSTRACT

Using a separate data register effectively increases the efficiency of an on-chip write buffer implemented as a FIFO structure. The separate register holds the output data during write cycles, allowing the write buffer FIFO to make the space consumed by the current write available at the start, rather than at the end of the write cycle. This effectively makes the write buffer "four and one-half" entries deep, thereby increasing performance of the buffer without adding additional FIFO entries.

2 Claims, 2 Drawing Sheets

USE OF A DATA REGISTER TO EFFECTIVELY INCREASE THE EFFICIENCY OF AN ON-CHIP WRITE BUFFER

FIELD OF THE INVENTION

This invention relates to a data register, and in particular to the use of a data register to effectively increase the efficiency of an on-chip write buffer.

BACKGROUND OF THE INVENTION

First-in first--out memories (FIFOs) are well known in the art. A typical prior art FIFO memory is disclosed in U.S. Pat. No. 4,151,609 issued to Moss in Apr. 24, 1979. FIFOs are similar to shift registers in that data entered at the input appear at the output in the same order. However, in a FIFO if the output queue is empty, data just entered will be available almost immediately. A typical application for a FIFO is to buffer an input device to a slower data-computation device. In this manner, no data are lost if the device is not ready for each input as it is generated, assuming the FIFO has not filled up completely. However, in the case that the FIFO is completely full, the input device must be halted, thereby decreasing performance. Increasing the depth of the FIFO to solve this problem results in a much larger register and additional control logic, both of which undesirably increase the size of the device.

SUMMARY OF THE INVENTION

In accordance with this invention, a first in first out (FIFO) structure is provided with a plurality of registers for storing address and data information from a central processing unit, transfer means coupled to these registers for writing the stored information to a memory, and control logic means, coupled to the registers and the transfer means, for selecting which of the registers will be loaded and which will be output. The transfer means includes a separate register for storing data information, thereby deepening the plurality of registers at a minimal increase in size.

DETAILED DESCRIPTION OF THE DRAWINGS

Figure 1:
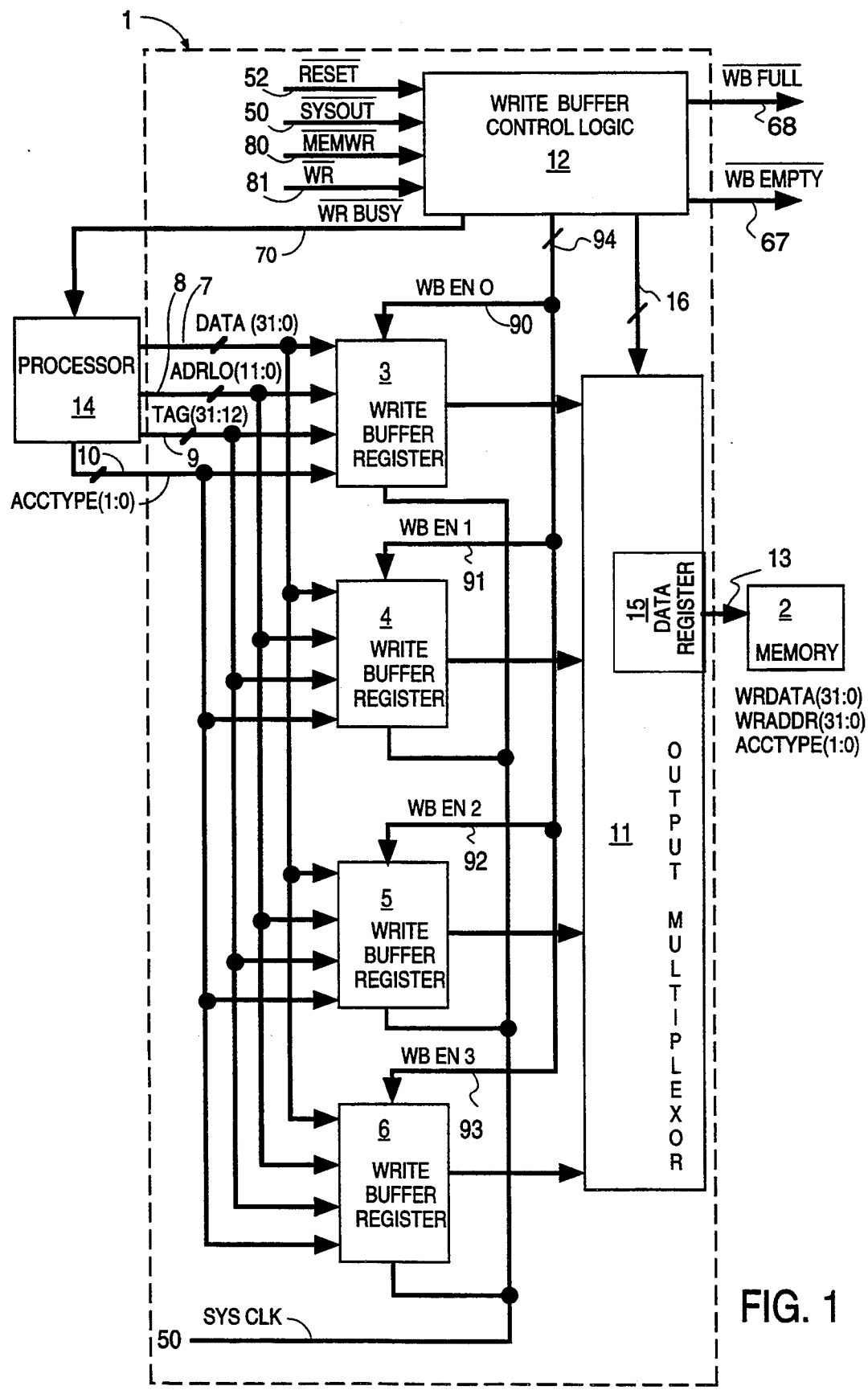
FIG. 1 illustrates a schematic diagram of a typical system which incorporates a separate data register with a conventional FIFO.

FIG. 1 illustrates a write buffer implemented as a FIFO 1 which captures write data from processor 14 at a processor data rate, and writes it to memory 2 at a slower rate. This organization increases system performance by allowing the processor 14 to continue execution even though the store has not been completed to memory. The FIFO or write buffer 1 in FIG. 1 is a four deep set of write buffer registers 3, 4, 5, and 6, where each set captures the data from the processor data bus 7, and captures the address and byte enable information from buses 8, 9, and 10. Address and byte enable information includes low-address (ADRLO) (4:0) on bus 8 (18-bit bus) which includes byte addresses used for transferring low addresses from the processor to the caches and memory interface, cache-tags (TAG) (31:12) on bus 9 (20-bit bus) used for transferring cache tags and high addresses between the processor, caches, and memory interface, and accumulator-type (ACCTYPE) (1:0) on bus 10 (3-bit bus) used to indicate the size of data being transferred on the data (DATA) (31:0) bus, whether or not a data transfer is occurring, and the purpose of the transfer. In the figures the slash (/) through a line is used to indicate a bus. Each write buffer register 3, 4, 5, or 6 must capture a 32 bit address and a 32 bit data value, plus two control bits indicating the size of datum. Write-data (WRDATA) (31:0) and write-address (WRADDR) (31:0) are signal paths for transferring data and address information, respectively. Note that (x:y) denotes that the respective signal is transmitted on bus signal lines y through x.

The four write buffer registers 3, 4, 5, and 6 are interconnected and controlled as illustrated in FIG. 1. Thus, the write buffer 1 is implemented as a set of four independent one deep write buffer registers 3, 4, 5, and 6 and an output multiplexer 11. Multiplexer 11 has a multiplexed address and data (AD) bus 13 connected to memory 2. Hence, a single set of pins (not shown) has the address for the transaction at one point in time and has the data portion during another time. Typically, the address is present on bus 13 for only half a clock cycle which, for a chip running at 25 MHz, is approximately 20 nanoseconds. Then, the bus is switched to the data portion of the input through the rest of the transaction. The write buffer control logic 12, illustrated in more detail in FIG. 2, controls which write buffer register, for example, 3, 4, 5, or 6, is written to. To the user, this organization will appear as a four deep FIFO of write buffer registers.

In accordance with the present invention, a register 15 is added to multiplexer 11. In one embodiment, register 15 is a 32-bit register which stores only data input originally into, for example, write buffer register 3. Because register 15 stores only data, it is small enough to occupy space already introduced by multiplexer 11.

When a write cycle is begun, the address from, for example, register 3 appears on bus 13, and the data from register 3 is captured by data register 15. In this manner, write buffer 1 is effectively freed of both the data and the address at the start of the transfer and may, as a result, begin a new store operation in register 3. During the remainder of the write cycle, the data stored in data register 15 is driven onto bus 13. Hence, processor 14 is released from its stall (assuming that write buffer registers 3, 4, 5, and 6 are full) at the beginning of the write cycle rather than waiting until the write cycle is complete. As a result, the write buffer is deepened to "four and one-half" entries which increases performance.

Figure 2:
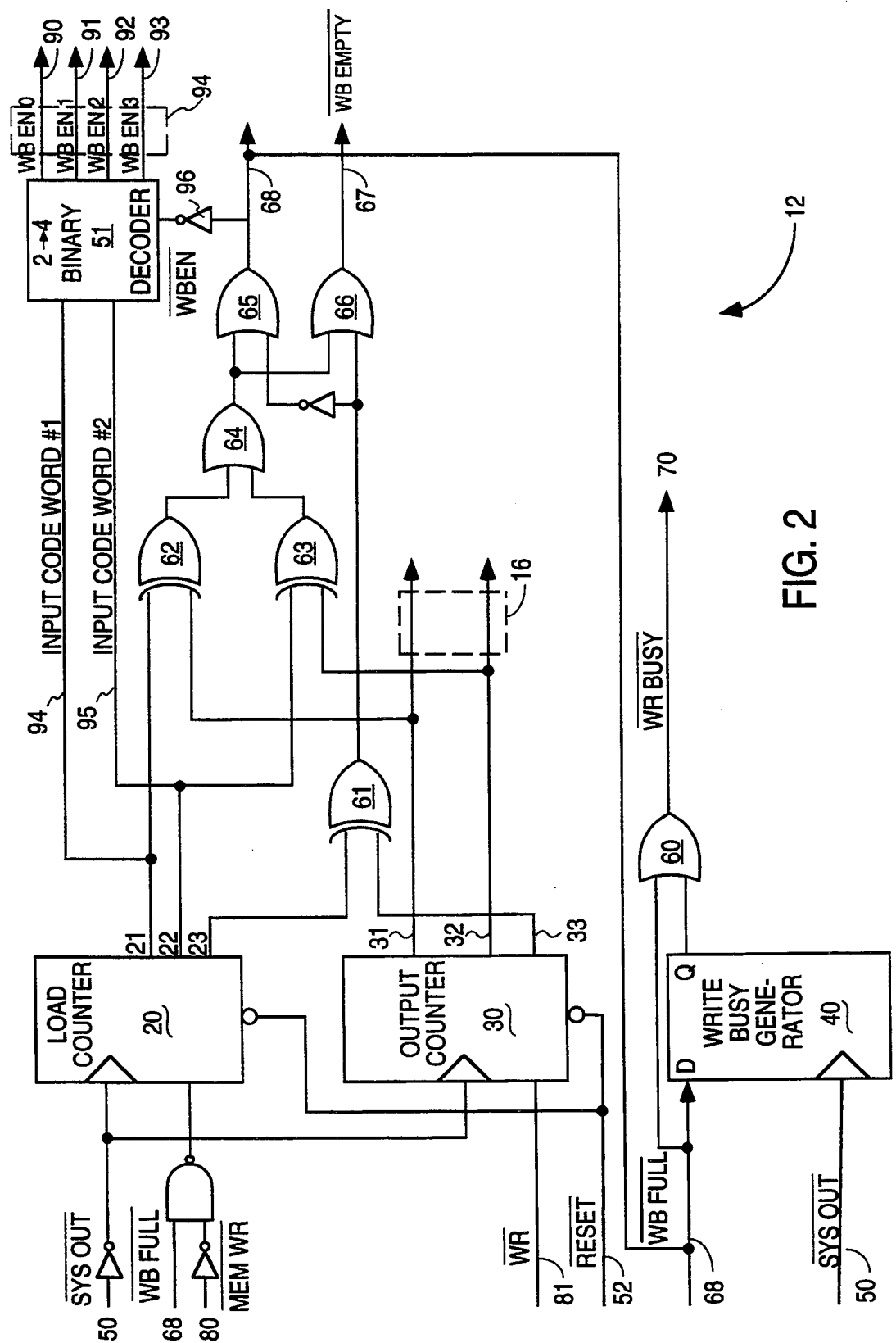
FIG. 2 shows the control logic used in one embodiment of the present invention to control the FIFO and separate data register.

One embodiment of the write buffer control logic 12, shown in FIG. 2, uses three-bit counters 20, 30 and $\overline{Sy}$ sOut clock signal received over line 50 to control the load and output selection respectively. Identically labelled elements in FIGS. 1 and 2 refer to the same element even though they appear in both FIGS. 1 and 2. Load counter 20 and output counter 30 may be implemented using a typical single counter, for example the IDT 74 FCT 161. When a $\overline{RESET}$ signal is transferred over line 52, all bits (associated with lines 21, 22, 23, 31, 32, 33) in load counter 20 and output counter 30 are set to zero. These signals are transferred through XOR gates 61, 62, 63 and OR gates 64, 65 and 66. This causes a zero signal or, a write buffer empty signal ($\overline{WbEmpty}$), to be asserted on line 67 indicating to memory 2 that no write requests are pending.

As discussed above, the selected write buffer register will constantly latch address and data information. In order to lock the data into write buffer registers 3, 4, 5 and 6, load counter 20 changes to indicate a different, i.e. available, location at the completion of a processor 14 write operation. Thus, load counter 20 changes to indicate that a different write buffer register is being loaded, assuming that write buffer 1 is not full. When the CPU core (not shown) performs a store operation, it asserts Memory Write signal $\overline{\text{Mem Wr}}$ on line 80. Load counter 20 increments when write buffer register 3, 4, 5 or 6 is loaded, as determined by the $\overline{\text{Mem Wr}}$ signal. Output counter 30 decrements, as determined by Start Write $\overline{\text{Wr}}$ signal on line 81, when data from write buffer 1 is transferred to memory 2 via bus 13.

When write buffer 1 has been filled, bits on lines 21, 22 of load counter 20 and bits on lines 31, 32 of output counter 30 will match; however, bits on lines 23 and 33 will be different, which indicates that write buffer registers 3, 4, 5 and 6 are all full. These signals, flowing through the control logic discussed above result in a Write Buffer Full $\overline{\text{Wb Full}}$ signal being asserted on line 68, i.e. the logic level is 0. This $\overline{\text{Wb Full}}$ signal is transferred via line 68 to Write Busy Generator (Wr Busy Generator) 40 (a standard D-type flip-flop) which subsequently, by Write Busy $\overline{\text{Wr Busy}}$ signal on line 70, stalls processor 14 on subsequent store operations, thus disabling all subsequent writes until write buffer 1 is no longer full. OR gate 60 and clock 50 synchronize the $\overline{\text{Wb Full}}$ signal with processor 14 to avoid unnecessary stalls as the fourth write buffer is written.

A write buffer register 3, 4, 5, or 6 is made available when its contents are presented to memory 2 via bus 13. This advances the output counter 30 to the next write buffer register. Note that if write buffer 1 is full, advancing output counter 30 will cause $\overline{\text{Wb Full}}$ signal to be negated on line 68.

In accordance with the present invention, bus 13 captures the address from register 3, 4, 5 or 6 while its associated data is held in register 15. In this manner, write buffer 1 advances to the next write buffer register at the beginning of the write operation to memory 2, not at the end. This allows maximum performance as processor 14 will perceive that write buffer 1 has room even while a write operation is in progress. Thus, a $\overline{\text{Wb Full}}$ signal which causes a stall in processor 14 will be terminated as soon as bus 13 begins the write transaction to memory 2.

Upon receipt of a write buffer enable signal $\overline{\text{Wb En}}$ from buffer inverter 96, binary decoder 51 converts coded input words #1 and #2 on lines 94, 95 respectively into output code words WBEn0, WBEn1, WBEn2 and WBEn3 on lines 90, 91, 92 and 93 respectively. If the $\overline{\text{Wb En}}$ signal is one, then the outputs WBEn0, WBEn1, WBEn2 and WBEn3 and are all zero. If, on the other hand, the $\overline{\text{Wb En}}$ signal is a zero, then, depending on the value of input code words #1 or #2, a particular output of lines 90-93 is a one while the others are zero. In this manner, decoder 51 selects via bus 94 which write buffer register is to be loaded.

For additional information regarding the operation of an illustrative system in which a data register in accordance with the present invention is used, reference is made the "IDT79R3051 Family Hardware User's Manual," copyrighted 1990, available from Integrated Device Technology, Inc., Santa Clara, Calif.

A FIFO structure in accordance with the present invention improves performance by allowing data from one write buffer register to be transferred to a separate data register, thereby allowing a write operation to progress and preventing an unnecessary stall.

We claim:

1. A first in first out (FIFO) structure comprising:
 a plurality of registers, each register having an address portion and a data portion for storing address and data information, respectively, received from a central processing unit, wherein said registers are coupled to said central processing unit via a common address and data bus;
 control logic means coupled to said plurality of registers for selecting one of said plurality of registers to be loaded with said address and data information from said central processing unit during a FIFO write cycle, and for selecting one of said plurality of registers having said data information to be transferred to an external memory; and
 transfer means coupled between said plurality of registers and said external memory for transferring said data information from said selected register having said data information to be transferred to said external memory, wherein said transfer means includes a separate data register for capturing and storing said data information from said selected register having said data information and wherein said transfer means further includes means for isolating said separate data register from said plurality of registers thereby deepening said plurality of registers by freeing up said address and data portions of said selected register before a next FIFO write cycle initiated by said central processing unit.

2. A first in first out structure of claim 1 wherein said transfer means includes a multiplexer coupled between each of said plurality of registers and said separate data register.